(12) United States Patent
Ahn et al.

(10) Patent No.: US 10,886,446 B2
(45) Date of Patent: Jan. 5, 2021

(54) MICRO LED STRUCTURE AND METHOD OF MANUFACTURING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/526,702

(22) Filed: Jul. 30, 2019

(65) Prior Publication Data
US 2020/0044127 A1 Feb. 6, 2020

(30) Foreign Application Priority Data
Aug. 2, 2018 (KR) .......................... 10-2018-0090398

(51) Int. Cl.
*H01L 33/62* (2010.01)
(52) U.S. Cl.
CPC ...... *H01L 33/62* (2013.01); *H01L 2933/0066* (2013.01)

(58) Field of Classification Search
CPC ........................... H01L 33/62; H01L 25/0753
See application file for complete search history.

(56) References Cited

U.S. PATENT DOCUMENTS

| 4,209,481 A | * | 6/1980 | Kashiro | .................. B29C 70/14 |
| | | | | 264/108 |
| 2017/0338374 A1 | * | 11/2017 | Zou | .......................... H01L 33/44 |

FOREIGN PATENT DOCUMENTS

| JP | 2016126960 A | * | 7/2016 |
| KR | 100731673 B1 | | 6/2007 |
| KR | 20140112486 A | | 9/2014 |
| KR | 20170019415 A | | 2/2017 |
| KR | 20170024906 A | | 3/2017 |
| KR | 20170026959 A | | 3/2017 |
| KR | 101754528 B | | 7/2017 |
| KR | 101757404 B1 | | 7/2017 |

* cited by examiner

*Primary Examiner* — Cuong Q Nguyen
*Assistant Examiner* — Shih Tsun A Chou

(57) ABSTRACT

The present invention relates generally to a micro LED structure and a method of manufacturing the same, and more particularly to a micro LED structure having an anisotropic conductive film between a micro LED and a target substrate to which the micro LED is bonded for electrically connect the micro LED and the target substrate together, and a method of manufacturing the same.

1 Claim, 4 Drawing Sheets

1

MICRO LED STRUCTURE AND METHOD OF MANUFACTURING SAME

CROSS REFERENCE TO RELATED APPLICATION

The present application claims priority to Korean Patent Application No. 10-2018-0090398, filed Aug. 2, 2018, the entire contents of which is incorporated herein for all purposes by this reference.

BACKGROUND OF THE INVENTION

Field of the Invention

The present invention relates generally to a micro LED structure and a method of manufacturing the same. More particularly, the present invention relates to a micro LED structure having an anisotropic conductive film filled with a conductive material, and a method of manufacturing the same.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. The micro LED is not a package type covered with a molded resin or the like, but a state of being cut from a wafer used for crystal growth. Liquid crystal and organic substances are the core materials of LCDs and OLEDs, respectively, whereas the micro LED display uses 1 μm to 100 μm of an LED chip itself as light emitting material.

Since the term "micro LED" emerged in the patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and mounting the LED chips on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). According to the Related Art 3, there is no damage to micro LEDs as compared with the above-mentioned electrostatic head. However, an adhesive force of the elastic transfer head is required to be higher than that of a target substrate in the transfer process to transfer micro LEDs stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and micro LEDs may be damaged when pressed with the roller.

Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since micro LEDs are immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that an additional process of applying a bonding material having an adhesive force to bonding surfaces of the pick-up heads is required to transfer micro LEDs.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

After the micro LED is transferred to the target substrate, a bonding process is performed, in which the micro LED is bonded to the target substrate. The micro LED can be bonded to the target substrate through the bonding process and electrically connected to the target substrate. Here, since the target substrate is provided with a first electrode and the micro LED is provided with a terminal, the first electrode and the micro LED terminal are electrically connected together.

Eutectic bonding can be used to bond the micro LED to the target substrate. Eutectic bonding is a method in which the target substrate where the micro LED is bonded is heated, and the heat transferred through the target substrate melts the bonding metal to bond the micro LED to the target substrate. In the case of eutectic bonding, a separate process for heating the target substrate is required, and a separate apparatus for performing the process is required. Therefore, it is troublesome to prepare the process and apparatus for performing the bonding process.

Also, an anisotropic conductive film (ACF) can be used to electrically connect the target substrate and the micro LED together. The anisotropic conductive film (ACF) is formed of multiple particles in which conductive cores are respectively coated with an insulating film. When pressure or heat is applied to the ACF, the insulating film is destroyed at regions to which the pressure or heat is applied, such that the micro LED and the target substrate are electrically connected to each other via exposed cores of the ACF.

The micro LED is very small in size and the separation distance between micro LEDs is narrow. As a result of this, the cores where the insulating film is destroyed by being applied with pressure or heat affect adjacent micro LEDs, causing the conduction problem. Further, in the case of a flip chip type micro LED, there is a problem that the separation distance between terminals of the micro LED is short, which causes the conduction problem and electrical short-circuit.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906

SUMMARY OF THE INVENTION

Accordingly, the present invention has been made keeping in mind the above problems occurring in the related art, and the present invention is intended to propose a micro LED structure, in which an anisotropic conductive film filled with a conductive material in the vertical direction is used to prevent the conduction problem between micro LEDs and between micro LED terminals caused by the influence of the conductive material, and a method of manufacturing the same.

In order to achieve the above object, according to one aspect of the present invention, there is provided a micro LED structure including: a micro LED; a target substrate to which the micro LED is bonded; and an anisotropic conductive film provided between the micro LED and the target substrate, wherein the anisotropic conductive film is formed by filling a conductive material in a plurality of holes formed vertically in an insulating porous film of elastic material, and the conductive material electrically connects the micro LED and the target substrate together.

Further, the plurality of holes may be irregularly formed.

According to another aspect of the present invention, there is provided a method of manufacturing a micro LED structure, the method including: preparing an insulating porous film of elastic material with a plurality of holes formed vertically therein, and forming an anisotropic conductive film by filling the plurality of holes with a conductive material; providing the anisotropic conductive film on a target substrate where a micro LED is bonded; and mounting the micro LED on the anisotropic conductive film.

According to the present invention, the micro LED structure and the method of manufacturing the same are provided with the anisotropic conductive film having conductivity in the vertical direction can prevent the conduction problem due to the separation distance between micro LEDs.

Further, when all of the plurality of holes of the anisotropic conductive film is filled with the conductive material, the anisotropic conductive film provided in the micro LED structure obtains the heat dissipation effect, thereby improving the luminous efficacy of the micro LED; and when only a part of the plurality of holes of the anisotropic conductive film is filled with the conductive material, the anisotropic conductive film obtains the effect of the insulation, thereby preventing the peeling problem of the micro LED to improve bonding efficiency.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Figure 1:
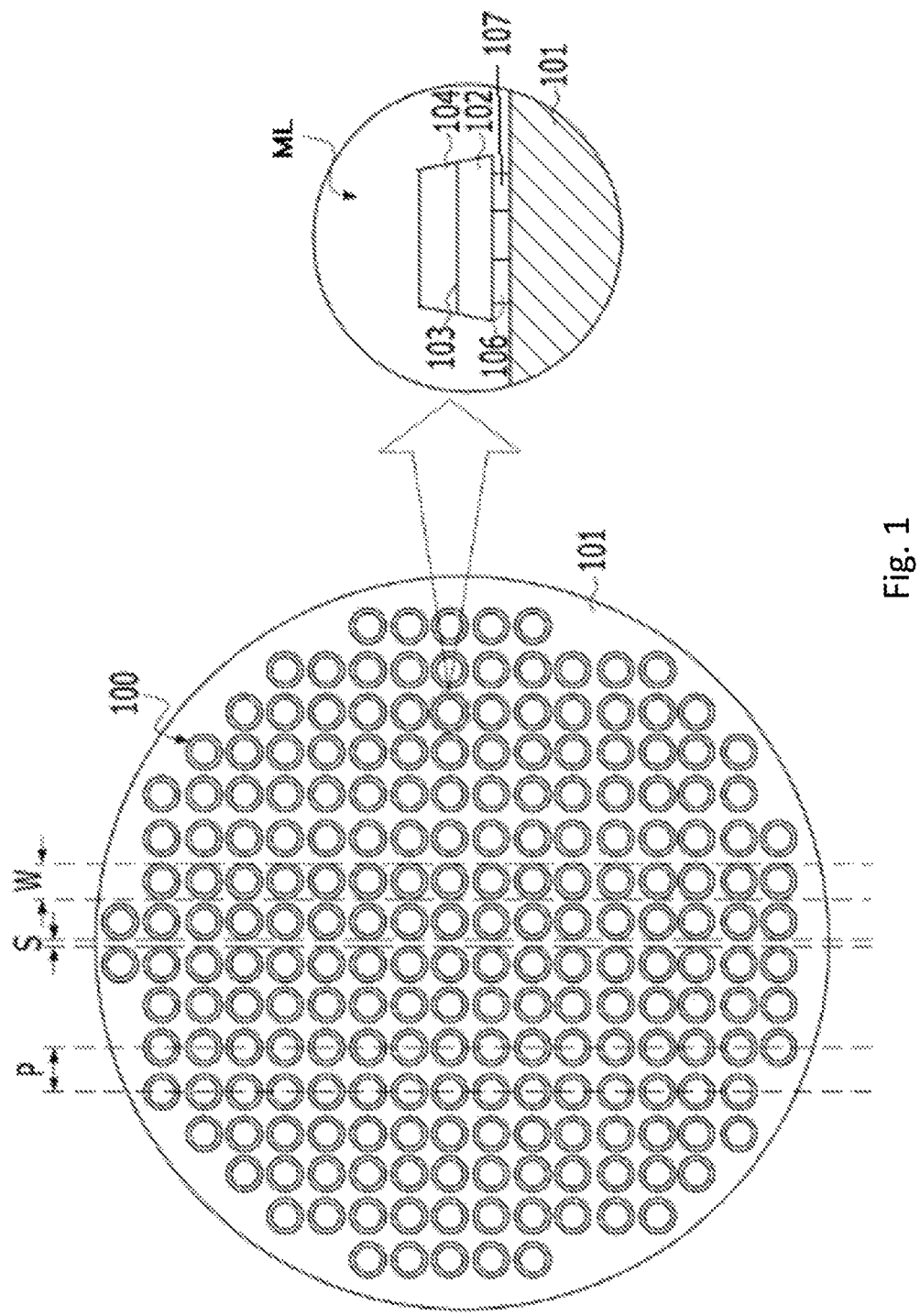
FIG. 1 is a view showing a micro LED that is an object of the present invention.

The following description merely illustrates the principles of the invention. Therefore, those skilled in the art will be able to invent various devices included in the concept and scope of the invention, even if not explicitly described or illustrated herein. It should be further understood that all conditional terms and embodiments listed in this specification are, in principle, explicitly intended only for the purpose of enabling the inventive concept to be understood, and are not limited to the specifically listed embodiments and conditions.

The above objects, features and advantages will become more apparent from the following detailed description taken in conjunction with the accompanying drawings, and thus, those skilled in the art will be able to easily carry out the technical concept of the invention.

The embodiments described herein will be described with reference to sectional and/or perspective views that are ideal exemplary views of the present invention. For explicit and convenient description of the technical content, thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be W used throughout different embodiments and the description to refer to the same or like elements or parts. In addition, the configuration and operation already described in other embodiments will be omitted for convenience.

Hereinafter, an exemplary embodiment of the present invention will be described in detail with reference to the accompanying drawings.

FIG. 1 is a view showing a micro LED mounted on a micro LED structure according to an exemplary embodiment of the present invention. The micro LED ML is fabricated and disposed on a growth substrate 101.

The micro LED ML emits light having wavelengths of different colors such as red, green, blue, white, and the like. With the micro LED, it is possible to realize white light by using fluorescent materials or by combining colors. The micro LED ML has a size of 1 μm to 100 μm.

The growth substrate 101 may be a conductive substrate or an insulating substrate. For example, the growth substrate 101 may be formed of at least one selected from the group consisting of sapphire ($Al_2O_3$), SiC, Si, GaAs, GaN, ZnO, Si, GaP, InP, Ge, and $Ga_2O_3$.

The micro LED ML may include: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba. The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may include an n-type semiconductor layer, and the second semiconductor layer 104 may include a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106 and the second contact electrode 107. The first contact electrode 106 and/or the second contact electrode 107 may be formed of various conductive materials including a metal, conductive oxide, and conductive polymer.

In FIG. 1, the letter 'P' denotes a pitch distance between the micro LEDs 100, °S° denotes a separation distance between the micro LEDs 100, and °W° denotes a width of each micro LEDs 100.

Figure 2A:
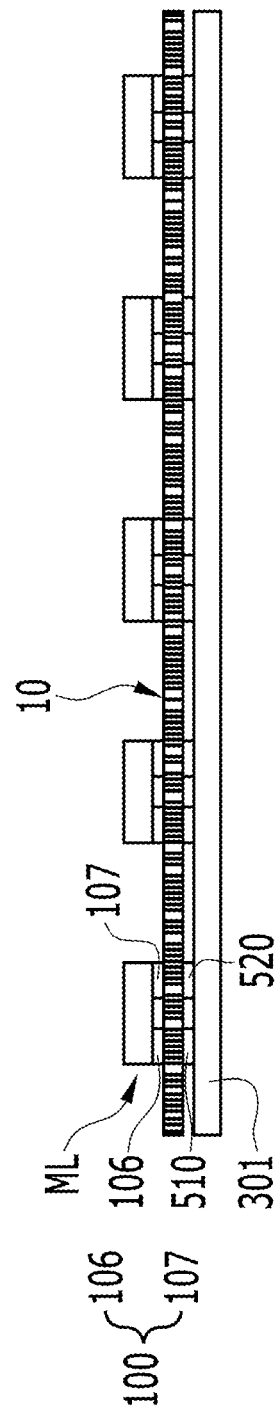
FIG. 2A and FIG. 2B are views showing a micro LED structure according to an exemplary embodiment of the present invention.
Figure 2B:
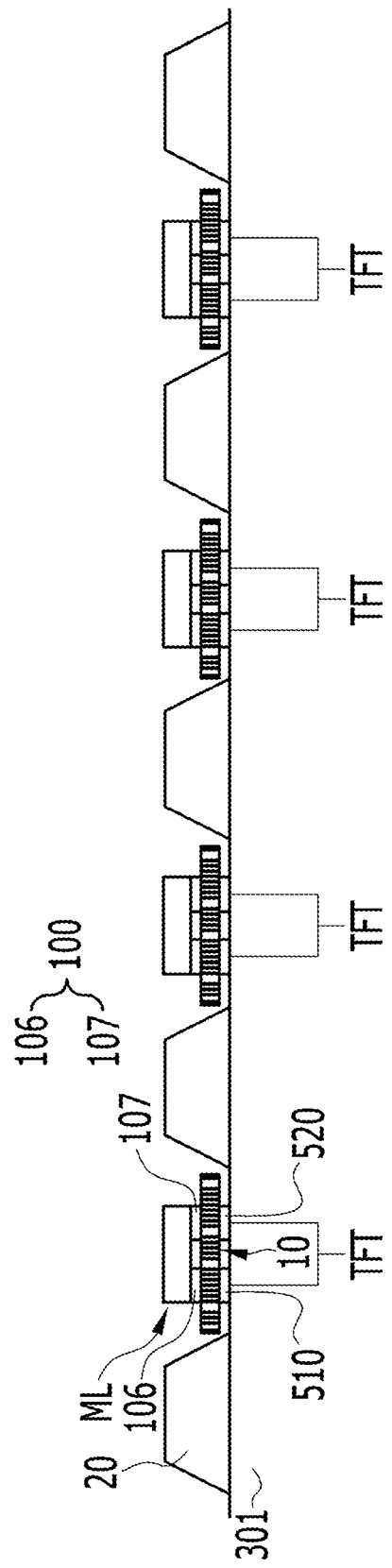

FIG. 2 shows a micro LED structure 1 according to an exemplary embodiment of the present invention. FIG. 2A is a view showing that an anisotropic conductive film 10 provided in the micro LED structure 1 of the present invention is continuous without being cut. FIG. 2B is a view showing that the anisotropic conductive film 10 of the micro LED structure 1 of the present invention is provided in correspondence with each micro LED ML in a cut form. As shown in FIG. 2, the micro LED structure 1 of the present invention includes: the micro LED ML; a target substrate 301 to which the micro LED ML is bonded; and the anisotropic conductive film 10 provided between the micro LED ML and the target substrate 301.

Hereinafter, the target substrate 301 bonded with the micro LED ML shown in FIG. 1 will be described.

The target substrate 301 driving the micro LED ML may include various materials. The target substrate 301 may be made of a transparent glass material having $SiO_2$ as a main component. However, materials of the target substrate 301 are not limited to this, and the target substrate 301 may be made of a transparent plastic material and have solubility. The plastic material may be an organic substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the target substrate 301, the target substrate 301 is required to be made of a transparent material. However, in the case of a top emission type in which an image is implemented in a direction opposite to the target substrate 301, the target substrate 301 is not required to be made of a transparent material. In this case, the target substrate 301 may be made of metal.

In the case of forming the target substrate 301 using metal, the target substrate 301 may be made of at least one metal selected from the group consisting of iron, chromium, manganese, nickel, titanium, molybdenum, stainless steel (SUS), Invar, Inconel, and Kovar, but is not limited thereto.

The target substrate 301 may include a buffer layer (not shown). The buffer layer may provide a flat surface and block foreign matter or moisture from penetrating therethrough. For example, the buffer layer may include an inorganic substance such as silicon oxides, silicon nitride, silicon oxynitride, aluminum oxide, aluminum nitride, titanium oxides, and titanium nitride, or an organic substance such as polyimide, polyester, and acrylic. Alternatively, the buffer layer may be formed in a stacked manner with the exemplified materials.

A thin film transistor (TFT) may include an active layer, a gate electrode, a source electrode, and a drain electrode.

Hereinafter, a case where a TFT is a top gate type in which the active layer, the gate electrode, the source electrode, and the drain electrode are sequentially formed will be described. However, the present embodiment is not limited thereto, and various types of TFTs such as a bottom gate TFT may be employed.

The active layer may contain a semiconductor material, such as amorphous silicon and polycrystalline silicon. However, the present embodiment is not limited thereto, and the active layer may contain various materials. As an alternative embodiment, the active layer may contain an organic semiconductor material and so on.

As another alternative embodiment, the active layer may contain an oxide semiconductor material. For example, the active layer may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer is formed on the active layer. The gate dielectric layer serves to isolate the active layer and the gate electrode. The gate dielectric layer may be formed into a multilayer or a single layer of a film made of an inorganic substance such as silicon oxide and/or silicon nitride.

The gate electrode is provided on the gate dielectric layer. The gate electrode may be connected to a gate line (not shown) applying an on/off signal to the TFT.

The gate electrode may be made of a low-resistivity metal. In consideration of adhesion with an adjacent layer, surface flatness of layers to be stacked, and processability, the gate electrode may be formed into a multilayer or a single layer, which is made of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film is provided on the gate electrode. The interlayer dielectric film isolates the source electrode, the drain electrode, and the gate electrode. The interlayer dielectric film may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiNx$), silicon oxynitride ($SiON$), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode and the drain electrode are provided on the interlayer dielectric film. The source electrode and the drain electrode may be formed into a multilayer or a single layer, which is made of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode and the drain electrode are electrically connected to a source region and a drain region of the active layer, respectively.

A planarization layer is provided on the TFT. The planarization layer is configured to cover the TFT, thereby eliminating steps caused by the TFT and planarizing the top surface. The planarization layer may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer may be formed into a multi-stack including an inorganic insulating layer and an organic insulating layer.

A first electrode 510 is provided on the planarization layer. The first electrode 510 may be electrically connected to the TFT. Specifically, the first electrode 510 may be electrically connected to the drain electrode through a contact hole formed in the planarization layer. The first electrode 510 may have various shapes. A bank layer 20 defining a pixel region may be disposed on the planarization layer. The shape in which the bank layer 20 is arranged may be referred to FIG. 2B to be described later. The bank layer 20 may include a recess where the micro LED ML will be received. The bank layer 20 may include, for example, a first bank layer defining the recess. A height of the first bank layer may be determined by a height and viewing angle of the micro LED ML. A size (width) of the recess may be determined by resolution, pixel density, and the like, of a display device. In an embodiment, the height of the micro LED ML may be greater than the height of the first bank layer. The recess may have a quadrangular cross section, but is not limited to this. The recess may have various cross section shapes, such as polygonal, rectangular, circular, conical, elliptical, and triangular.

The bank layer 20 may further include a second bank layer. A conductive layer may be disposed on the second bank layer. The conductive layer may be disposed in a direction parallel to a data line or a scan line, and may be electrically connected to a second electrode 520. However, the present invention is not limited thereto. The second bank layer may be omitted, and the conductive layer may be disposed on the first bank layer. Alternatively, the second bank layer and the conductive layer may be omitted, and the second electrode 520 may be formed over the entire target substrate 301 such that the second electrode 520 serves as a shared electrode that pixels (P) share. The first bank layer and the second bank layer may include a material absorbing at least a part of light, a light reflective material, or a light scattering material. The first bank layer and the second bank layer may include an insulating material that is translucent or opaque to visible light (e.g., light in a wavelength range of 380 nm).

For example, the first bank layer and the second bank layer may be made of a thermoplastic such as polycarbonate (PC), polyethylene terephthalate (PET), polyethersulfone, polyvinyl butyral, polyphenylene ether, polyamide, polyetherimide, polynorbonene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer and the second bank layer may be made of an inorganic insulating substance such as inorganic oxide and inorganic nitride including $SiOx$, $SiNx$, $SiNxOy$, $AlOx$, $TiOx$, $TaOx$, and $ZnOx$, but are not limited thereto. In an embodiment, the first bank layer and the second bank layer may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer and the second bank layer may be a distributed Bragg reflector (DBR) having high reflectivity or a mirror reflector made of metal.

The micro LED ML is disposed in. The micro LED ML may be electrically connected to the first electrode 510 and the second electrode 520 at the recess.

The micro LED ML emits light having wavelengths of different colors such as red, green, blue, white, and the like. With the micro LED ML, it is possible to realize white light by using fluorescent materials or by combining colors. The micro LED ML has a size in the micrometer (µm) range.

The micro LED ML includes the first contact electrode 106, and the second contact electrode 107. The first contact electrode 106 may be connected to the first electrode 510, and the second contact electrode 107 may be connected to the second electrode 520.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 520 may be made of a transparent conductive substance such as ITO, IZO, ZnO, and $In_2O_3$.

The anisotropic conductive film 10 is provided on the target substrate 301 constructed as described above. The anisotropic conductive film 10 is provided between the micro LED ML and the target substrate 301 to electrically connect the target substrate 301 and the micro LED ML together.

As shown in FIG. 2, the anisotropic conductive film 10 is formed by filling a plurality of holes formed vertically in an insulating porous film of elastic material with a conductive material 10b. In other words, the anisotropic conductive film. 10 may be formed by filling the vertical hole of the insulating porous film with the conductive material 10b.

The plurality of vertical holes formed in the insulating porous film is irregularly formed. Thus, holes 10a of the anisotropic conductive film 10 formed by filling the vertical holes with the conductive material 10b may be irregularly formed. As shown in FIG. 2, the holes 10a filled with the conductive material 10b are formed irregularly with different separation distances. Since each of the holes 10a is independently formed, the conductive material 10b filled in each of the holes 10a is not connected to adjacent one and provided independently. In other words, since the holes 10a are irregularly and vertically formed, the conductive material 10b filled in each of the holes 10a is also irregularly and vertically formed. The vertically formed conductive material 10b prevents the conduction problem caused when the conductive material 10b is transferred in the horizontal direction to affect an adjacent micro LED ML and a terminal 100 such as the first contact electrode 106 and the second contact electrode 107 of the micro LED.

When the conductive material 10b is filled in the plurality of vertical holes of the insulating porous film such that the anisotropic conductive film 10 is formed, which is conductive in the vertical direction and nonconductive in the horizontal direction. The anisotropic conductive film 10 may be formed by filling at least one vertical hole of the insulating porous film with the conductive material 10b. Herein, the conductive material 10b may be a thermally conductive material 10b or an electrically conductive material 10b. Here, a material of the conductive material is not limited, provided that the material is conductive.

As shown in FIG. 2, the conductive material 10b may be filled in all of the holes 10a of the anisotropic conductive film 10. The anisotropic conductive film 10 may be divided into a region where the micro LED ML is mounted and a region where the micro LED ML is not mounted. Herein, the region where the micro LED ML is mounted may be divided into a direct contact area directly in contact with the terminal 100 of the micro LED ML and a micro LED non-contact area corresponding to a part without having the terminal 100 of the micro LED ML.

Firstly, a case where the conductive material 10b is filled in all of the holes 10a of the anisotropic conductive film 10 continuously provided in the micro LED structure 1 will be described with reference to FIG. 2A. As shown in FIG. 2A, the anisotropic conductive film 10 is continuously provided between the micro LED ML and the target substrate 301. As a result, each micro LED ML may be mounted on a single anisotropic conductive film 10 provided on the target substrate 301 with a separation distance therebetween. The conductive material 10b may be filled in all of the holes 10a including a micro LED mounting region and a micro LED non-mounting region of the continuously provided anisotropic conductive film 10. In this case, the micro LED mounting region may be divided into a direct contact area directly in contact with the terminal 100 of the micro LED ML and a micro LED non-contact area corresponding to a part without having the terminal 100 of the micro LED ML, and the conductive material 10b may be filled in all of the holes 10a including the same.

As the conductive material 10b is filled in the holes 10a in the direct contact area directly in contact with the terminal 100 of the micro LED ML of the micro LED mounting region, the direct contact area has conductivity in the vertical direction through the conductive material 10b. Thus, the micro LED ML terminal 100, and the first electrode 510 and the second electrode 520 of the target substrate 301 are electrically connected to each other. In the case of the anisotropic conductive film 10, since the vertical hole of the insulating porous film of elastic material is filled with the conductive material 10b, it may be elastically deformed. Therefore, when the micro LED ML is mounted on the micro LED mounting region and the direct contact area and the terminal 100 are brought in contact with each other, the direct contact area can be elastically deformed by pressure or thermocompression. In other words, the direct contact area can be elastically deformed by pressure or thermocompression to electrically connect the micro LED ML terminal 100, the first electrode 510, and the second electrode with each other.

The conductive material 10b is also filled in the holes 10a in the micro LED non-contact area of the micro LED mounting region. In the non-contact area, the heat generated in the micro LED ML can be effectively dissipated in the vertical direction through the conductive material 10b. The heat dissipation through the conductive material 10b can be effectively implemented when the conductive material 10b is a thermally conductive material.

The micro LED structure 1 provided with the anisotropic conductive film 10 having conductivity in the vertical direction can effectively block heat generated in the micro LED ML from being transferred in the horizontal direction. In a conventional anisotropic conductive film (ACF), heat can be transferred in either the vertical or horizontal direction by a core in which an insulating film is destroyed. As a result, luminous efficacy may be lowered by the influence of the heat generated in any one of the micro LEDs ML on adjacent micro LED ML. However, since the micro LED structure 1 of the present invention is provided with the anisotropic conductive film 10 having conductivity in the vertical direction, it is possible to minimize the influence of the heat generated in the micro LED ML on adjacent micro LED ML, thereby improving the luminous efficacy of the micro LED ML.

The micro LED structure 1 can electrically connect the terminal 100, the first electrode 510, and the second electrode 520 with each other in the direct contact area through the conductivity in the vertical direction without affecting adjacent micro LED ML and the micro LED ML terminal 100. In the present invention, a flip chip type micro LED ML in which the terminal 100 of the micro LED ML protrudes from the bottom of the first semiconductor layer 102 is shown as an example of the micro LED ML. In this case, not only does the micro LED ML have a narrow separation distance between the micro LEDs ML due to a small size thereof, but also the separation distance between the terminals 100 of the micro LED ML may be narrow. Herein, the separation distance between the terminals 100 may refer to the separation distance between the terminal 100 of one micro LED ML and the terminal 100 of adjacent micro LED ML or the separation distance between the first contact electrode 106 and the second contact electrode 107 of one micro LED ML. When the micro LED ML is electrically connected to the target substrate 301 via the anisotropic conductive film (ACF), a core in which an insulating film is destroyed by pressure or heat is transferred and affects an adjacent micro LED ML or a micro LED ML terminal in the horizontal direction, thereby causing a conduction problem. However, as in the micro LED structure 1 of the present invention, when the anisotropic conductive film 10 having conductivity in the vertical direction is provided, only the first contact electrode 106 and the first electrode 510, and the second contact electrode 107 and the second electrode 520 can be electrically connected to each other, and there is no conductivity in the horizontal direction, so the problem of electrically affecting an adjacent micro LED ML or the terminal 100 of the micro LED ML may be eliminated.

Meanwhile, the anisotropic conductive film 10 may be provided in a cut form. FIG. 2B shows the micro LED structure 1 in which a pixel region is defined by the bank layer 20. In the micro LED structure 1, the anisotropic conductive film 10 is provided in a cut form. The anisotropic conductive film 10 may be provided corresponding to each micro LED ML.

Figure 3A:
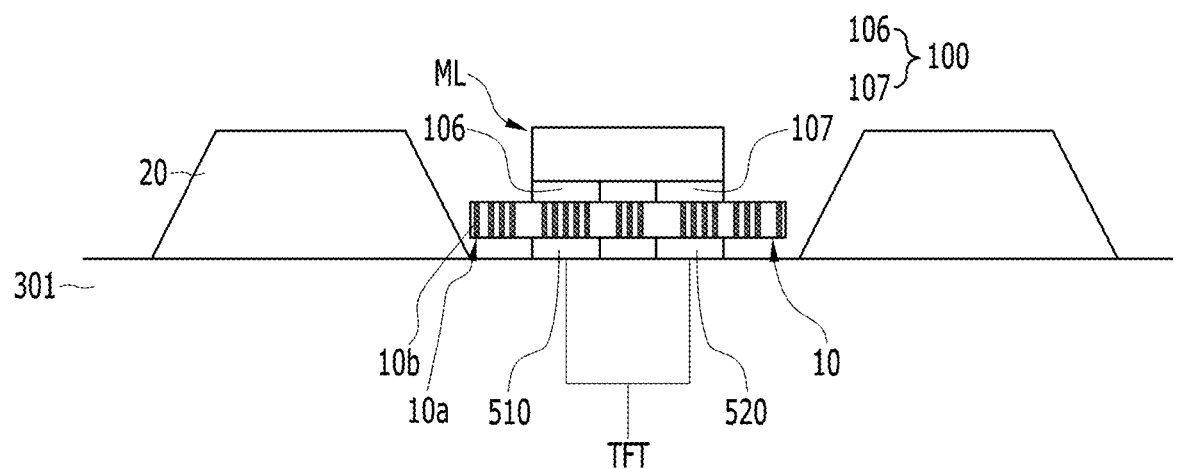
FIG. 3A and FIG. 3B are enlarged views showing the micro LED structure of the present invention.
Figure 3B:
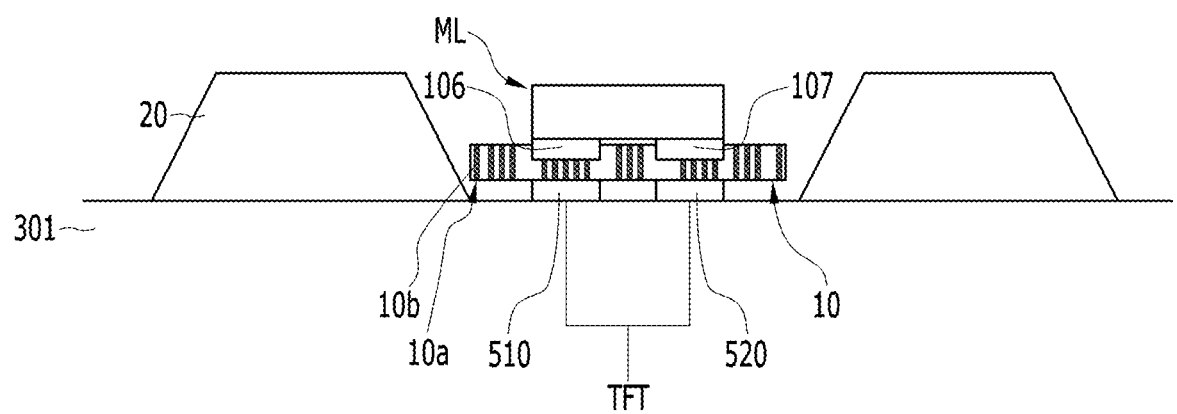

The micro LED structure 1 provided with the anisotropic conductive film 10 in a cut form will be described in detail with reference to FIG. 3. FIG. 3A and FIG. 3B are enlarged views showing the micro LED structure 1 in which a pixel region is defined by the bank layer 20. FIG. 3A is a view showing the micro LED structure 1 without pressure or heat applied thereto, and FIG. 3B is a view showing the micro LED structure 1 in which the anisotropic conductive film 10 is elastically deformed by pressure or heat applied thereto.

As shown in FIG. 3, the micro LED structure 1 in which a pixel region is defined by the bank layer 20 is configured such that the anisotropic conductive film 10 is provided in the cut form at the recess of the bank layer 20 on which the micro LED ML is mounted. The anisotropic conductive film 10 is configured such that the conductive material 10b is filled in all of the vertical holes 10a including a region where the micro LED ML is mounted and a region where the micro LED ML is not mounted.

As shown in FIG. 3A, if no pressure or heat is applied to the micro LED ML, the direct contact area of the micro LED mounting region of the anisotropic conductive film 10 remains not being elastically deformed.

When pressure or heat is applied to the micro LED ML, the direct contact area of the micro LED mounting region is elastically deformed by the pressure or heat. As shown in FIG. 3B, the direct contact area is in the state of being elastically deformed by pressure or heat applied to the micro LED ML. This can be realized by the anisotropic conductive film 10 made of an elastic material. The anisotropic conductive film 10, which is elastically deformed, can prevent the terminal 100 from being damaged due to contact between the terminal 100 and the anisotropic conductive film 10.

The anisotropic conductive film 10 may be formed by filling the plurality of vertical holes 10a with the conductive material 10b. Alternatively, the anisotropic conductive film 10 may be formed by filling only a part of the plurality of vertical holes 10a with the conductive material 10b. In other words, the anisotropic conductive film 10 may be formed by filling the conductive material 10b only in a part of the holes 10a in the direct contact area of the micro LED mounting region. The configuration in which the conductive material 10b is filled in only a part of the holes 10a of the anisotropic conductive film 10 can be realized through the masking process. However, any filling method other than the masking process may be used, provided that the conductive material 10b is filled only in a part of the holes 10a of the insulating porous film by performing the filling method.

When the conductive material 10b is filled only in the direct contact area of the micro LED mounting region of the anisotropic conductive film 10, the effect of the insulation can be obtained through the holes 10a that are not filled with the conductive material 10b. For example, the conductive material 10b is filled in the direct contact area of the micro LED structure 1 shown in FIG. 3B, and the conductive material 10b is filled neither in the micro LED non-mounting region nor in the micro LED non-contact area of the micro LED mounting region except the direct contact area. When pressure or heat is applied to the micro LED ML, the micro LED ML and the target substrate 301 are electrically connected to each other through the direct contact area of the micro LED mounting region filled with the conductive material 10b. In this case, the non-contact area of the micro LED mounting region without being filled with the conductive material 10b can perform the insulation function through air in the holes 10a for the direct contact area filled with the conductive material 10b. This minimizes the peeling problem of the micro LED ML from the target substrate 301. In the case of the anisotropic conductive film 10, since the holes 10a are irregularly formed, heat may be transferred through the regions where the holes 10a are not formed. However, the entire heat transfer flow can be prevented through holes 10a without being filled with the conductive material 10b that irregularly exists. Thus, the anisotropic conductive film 10 formed by filling the conductive material 10b only in a part of the holes 10a can perform the insulation function.

Hereinafter, a method of manufacturing the micro LED structure 1 of the present invention will be described with reference to FIG. 4. FIG. 4 partially shows a method of manufacturing the micro LED structure 1 of the present invention.

The method of manufacturing micro LED structure 1 includes: a first step S1 in which the anisotropic conductive film 10 is formed by filling the plurality of holes 10a formed vertically in the insulating porous film of elastic material with the conductive material 10b; a second step S2 in which the anisotropic conductive film 10 is provided on the target substrate 301 where the micro LED ML is bonded; and a third step S3 in which the micro LED ML is mounted on the anisotropic conductive film 10.

Figure 4A:
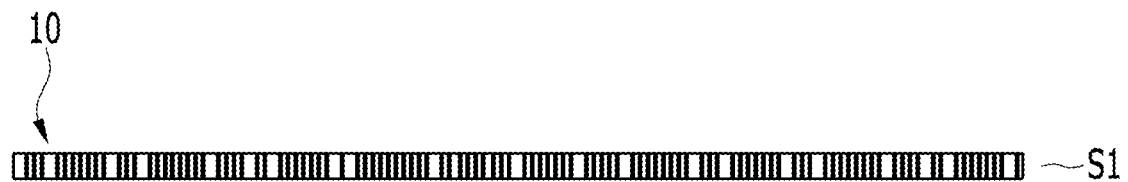
FIG. 4A to FIG. 4C are views partially showing a method of manufacturing the micro LED structure according to an exemplary embodiment of the present invention.

Firstly, forming of the anisotropic conductive film 10 will be described. The insulating porous film of elastic material in which the plurality of holes 10a is formed vertically is prepared. Then, the conductive material 10b is filled in the plurality of vertical holes 10a. Thereby, as shown in FIG. 4A, the anisotropic conductive film 10 in which the plurality of holes 10a is filled with the conductive material 10b is formed and has conductivity in the vertical direction.

Of the plurality of holes 10a of the anisotropic conductive film 10, all of the plurality of holes 10a may be filled with the conductive material 10b, or only a part of the plurality of holes 10a may be filled with the conductive material 10b. When all of the plurality of holes 10a of the anisotropic conductive film 10 is filled with the conductive material 10b, the anisotropic conductive film 10 can performed the heat dissipation function, thereby increasing the luminous efficacy of the micro LED ML. Meanwhile, when only a part of the plurality of holes 10a of the anisotropic conductive film 10 is filled with the conductive material 10b, the anisotropic conductive film 10 can perform the insulation function, thereby preventing the peeling problem of the micro LED ML from the target substrate 301. Herein, the part of the plurality of holes 10a of the anisotropic conductive film 10 may refer to the direct contact area of the micro LED mounting region.

Figure 4B:
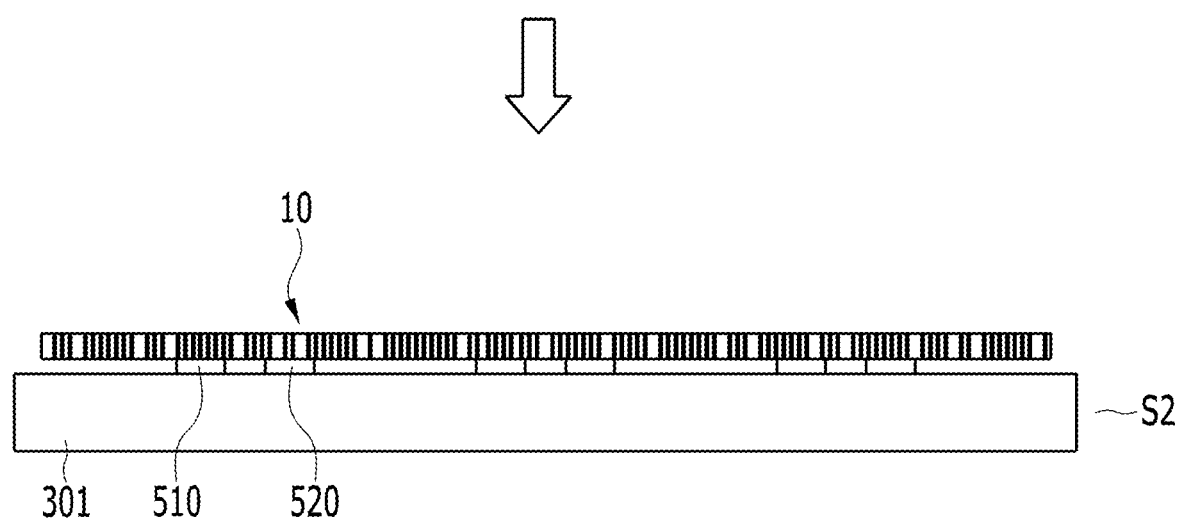

The anisotropic conductive film 10 formed through the first step S1 is, as shown in FIG. 4B, provided on the target substrate 301 where the micro LED ML is bonded in the second step S2. The anisotropic conductive film 10 may be provided in a continuous form, as shown in FIG. 4B, such that one anisotropic conductive film is provided on the target substrate 301, or may be provided in a cut form to correspond to each micro LED ML. When the anisotropic conductive film 10 is provided in a cut form, after the first step S1, a step of cutting the anisotropic conductive film 10 may be performed. The anisotropic conductive film 10 may be provided on the target substrate 301 by using a suitable method of moving the anisotropic conductive film 10.

Figure 4C:
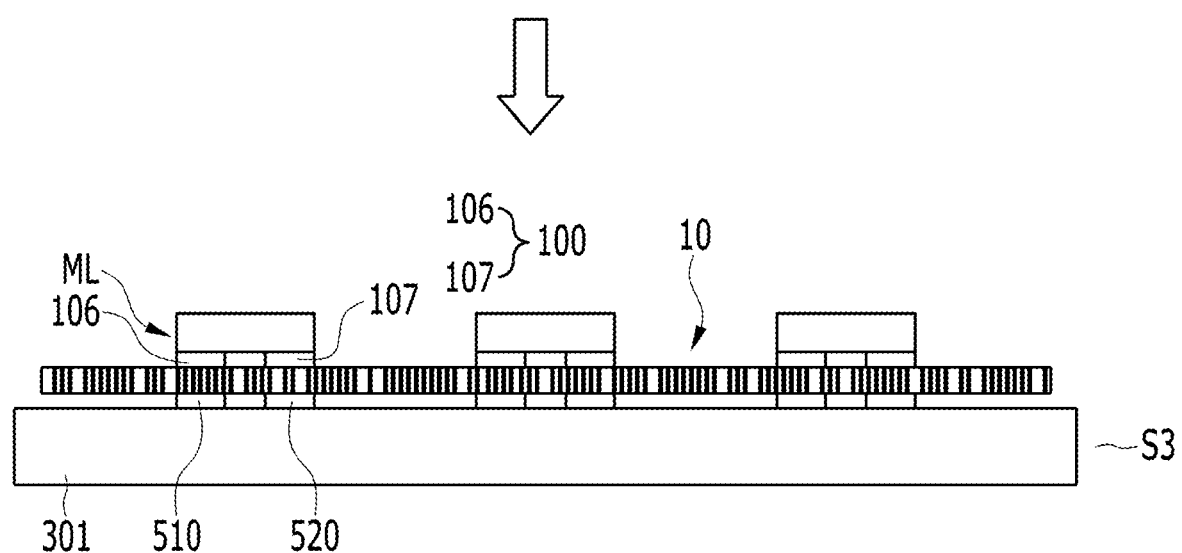

After the second step S2, as shown in FIG. 4C, the third step S3 in which the micro LED ML is mounted on the anisotropic conductive film 10 is performed. Thereafter, pressure or heat is applied to the micro LED ML to electrically connect the micro LED ML and the target substrate 301 together. In this case, the anisotropic conductive film 10 provided between the micro LED ML and the target substrate 301 may be elastically deformed at a portion where pressure or heat is applied.

As such, the micro LED structure 1 is provided with the anisotropic conductive film 10 having conductivity in the vertical direction to prevent the conduction problem caused when the conductive material 10b is transferred in the horizontal direction. Further, when all of the plurality of holes 10a of the anisotropic conductive film 10 is filled with the conductive material 10b, the anisotropic conductive film 10 provided in the micro LED structure 1 obtains the heat dissipation effect, thereby improving the luminous efficacy of the micro LED; and when only a part of the plurality of holes 10a of the anisotropic conductive film 10 is filled with the conductive material 10b, the anisotropic conductive film 10 obtains the effect of the insulation, thereby preventing the peeling problem of the micro LED ML.

As described above, although the exemplary embodiments of the present invention have been disclosed, those skilled in the art will appreciate that various modifications or changes are possible, without departing from the scope and spirit of the invention as disclosed in the accompanying claims.

What is claimed is:

1. A micro light-emitting diode (LED) structure comprising:
   a micro LED;
   a target substrate to which the micro LED is bonded; and
   an anisotropic conductive film provided between the micro LED and the target substrate,
   wherein the anisotropic conductive film includes:
   an insulating porous film of elastic material including a plurality of holes, wherein the plurality of holes are vertically formed, the plurality of holes are irregularly formed with different separation distances, and each of the plurality of holes is independently formed; and
   a conductive material electrically connecting the micro LED and the target substrate together,
   wherein the plurality of holes includes a first plurality of holes in an electrical contact area of the micro LED that are filled with the conductive material and a second plurality of holes in a non-electrical contact area of the micro LED that are not filled with the conductive material, and wherein the conductive material fills the first plurality of holes using a masking process.

* * * * *